United States Patent [19]

Wilkinson et al.

[11] Patent Number: 5,284,413
[45] Date of Patent: Feb. 8, 1994

[54] APPARATUS FOR LOADING AND UNLOADING THIN INTEGRATED CIRCUITS INTO AND FROM CARRIERS

[75] Inventors: David Wilkinson, Danville; Donald Becker, Milpitas, both of Calif.

[73] Assignee: Intelmatec Corporation, Fremont, Calif.

[21] Appl. No.: 925,078

[22] Filed: Aug. 5, 1992

[51] Int. Cl.⁵ .................... H01L 21/58; G01R 31/00
[52] U.S. Cl. ........................ 414/416; 294/2; 294/65; 29/743
[58] Field of Search .............. 414/416, 737, 736, 729, 414/752, 627, 618; 294/2, 65; 29/739, 740, 741, 760, 762, 743; 901/40, 31

[56] References Cited

U.S. PATENT DOCUMENTS

| | | | |
|---|---|---|---|
| 4,627,785 | 12/1986 | Monforte | 294/2 X |
| 4,753,004 | 6/1988 | Fujioka | 294/2 X |
| 4,776,745 | 10/1988 | Foley | 414/416 X |
| 4,796,357 | 1/1989 | Smith | 294/2 X |
| 4,875,279 | 10/1989 | Sakiadis | 294/2 X |
| 4,883,300 | 11/1989 | Akagawa | 294/2 |
| 4,910,864 | 3/1990 | Elliott | 294/2 X |
| 5,050,919 | 9/1991 | Yakou | 294/2 |
| 5,073,079 | 12/1991 | Akagawa | 414/416 |
| 5,223,785 | 6/1993 | Becker | 414/416 X |

FOREIGN PATENT DOCUMENTS 61-165338  7/1987  Japan .......................... 414/416

Primary Examiner—Michael S. Huppert
Assistant Examiner—James T. Eller, Jr.
Attorney, Agent, or Firm—Heller, Ehrman, White & McAuliffe

[57] ABSTRACT

Carriers of a type, each with two elastically bendable holding pieces extending inwardly from its frame-like housing to hold a thin integrated circuit (IC) therebetween, are delivered to a specified pick-up location. A robotically operated pick-up module has a frame-like structure with windows, admits these carriers individually into these windows, and clamps them within these windows by means of an actuator-controlled clamping member. After they are brought to a transfer station having seats with openings connected to a negative pressure source, their holding pieces are pushed apart by activating another actuator within the module so as to move claw-like unlatching members. The ICs, which are then placed on the seats of the transfer station and released from their carriers, are picked up by vacuum suction pipes connected to vacuum pumps. While these ICs are suspended at bottom openings of these suction pipes, the module is robotically taken to a specified discharge location where the carriers, which are now empty, are released from their clamped conditions as the actuator-controlled clamping member is retracted. The ICs are thereafter brought to their desired positions and dropped off from the bottom openings of the suction pipes. By a reverse process and with the help of a device for precisely positioning the ICs, the same apparatus may be used for robotically loading ICs into carriers.

9 Claims, 5 Drawing Sheets

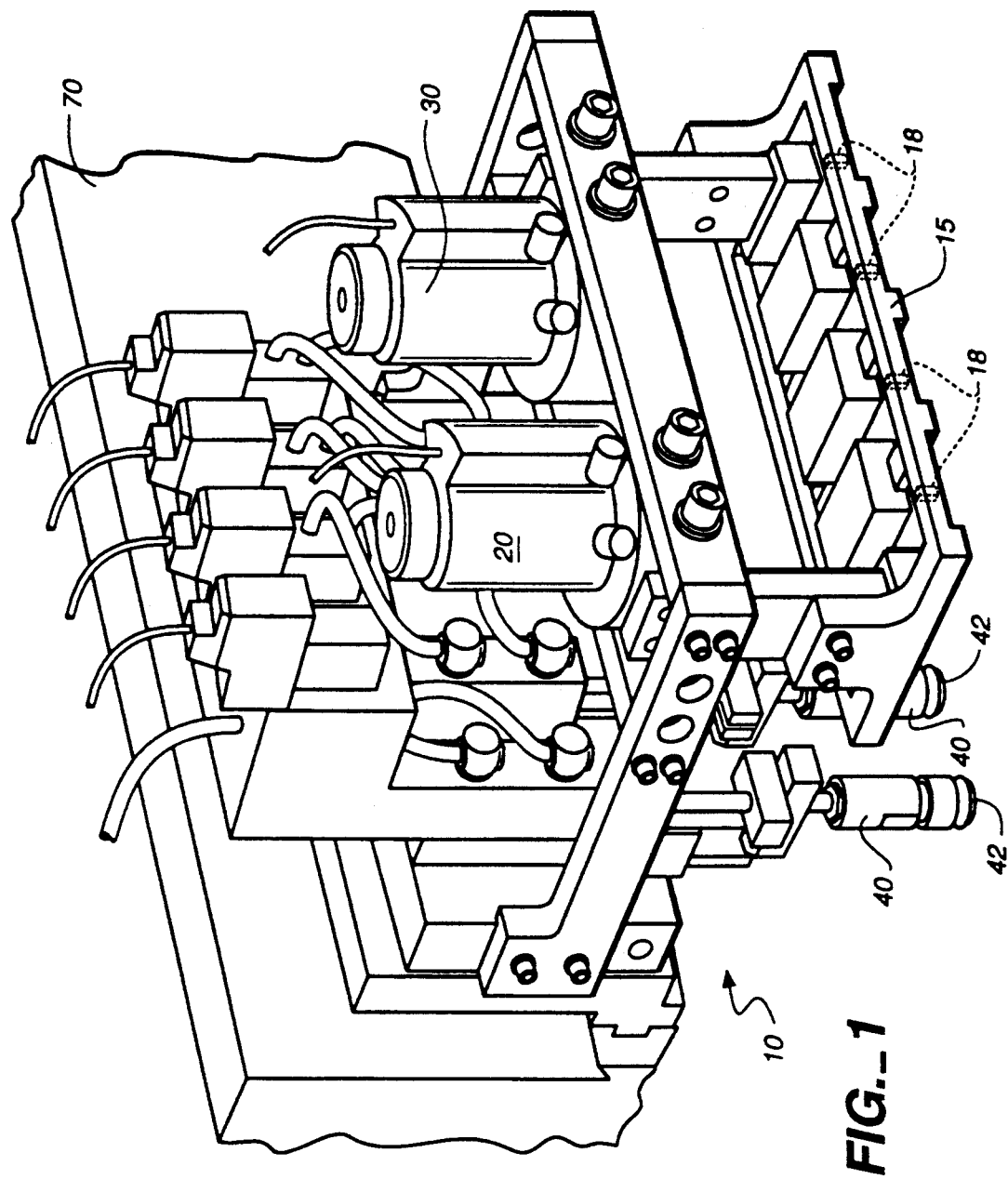
FIG._1

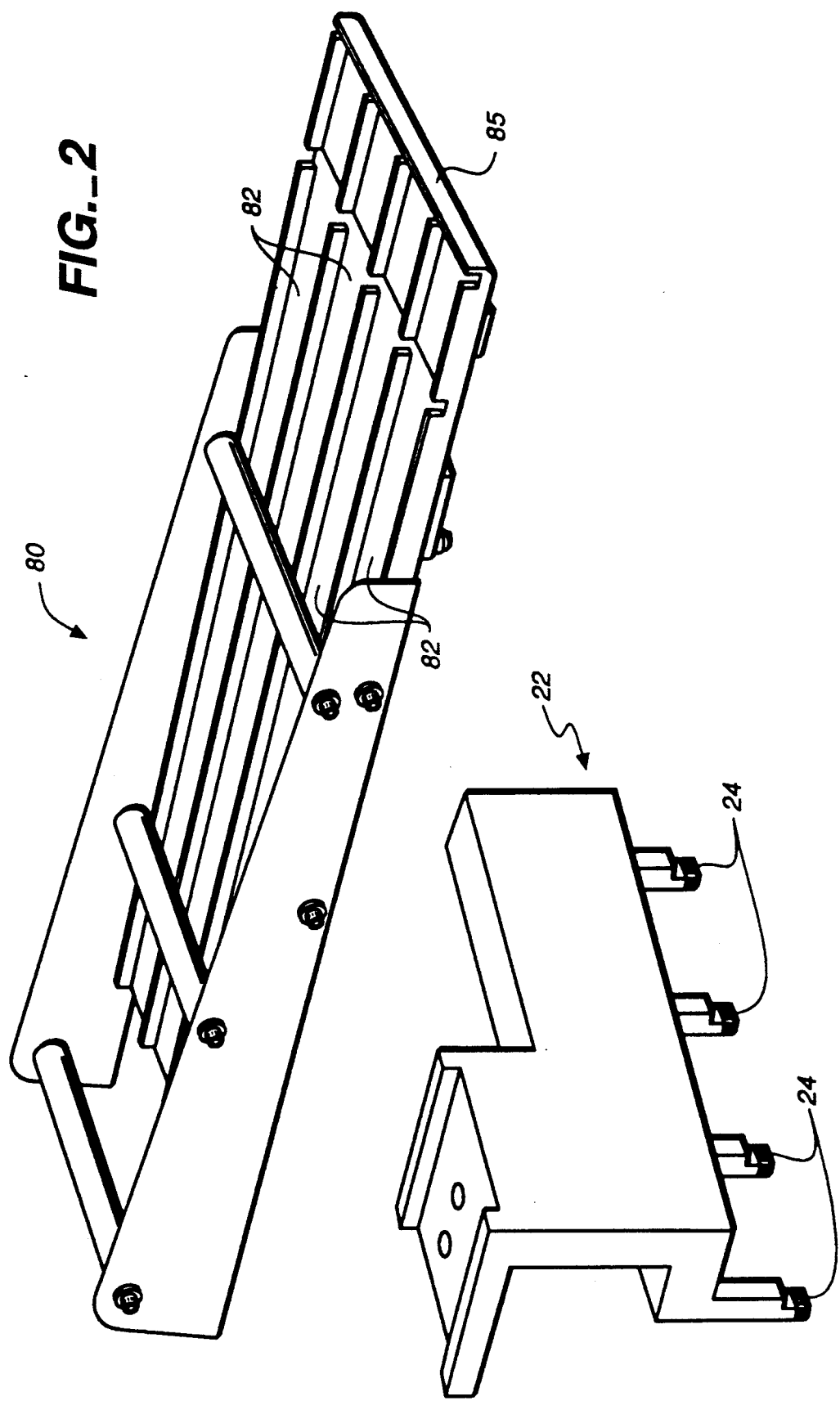

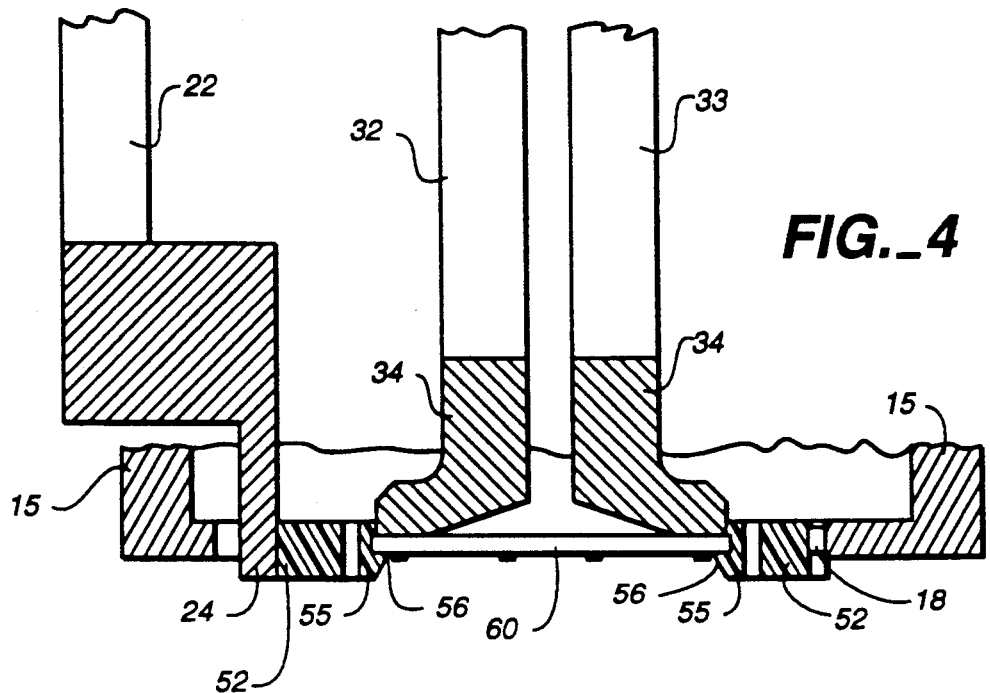
FIG._4
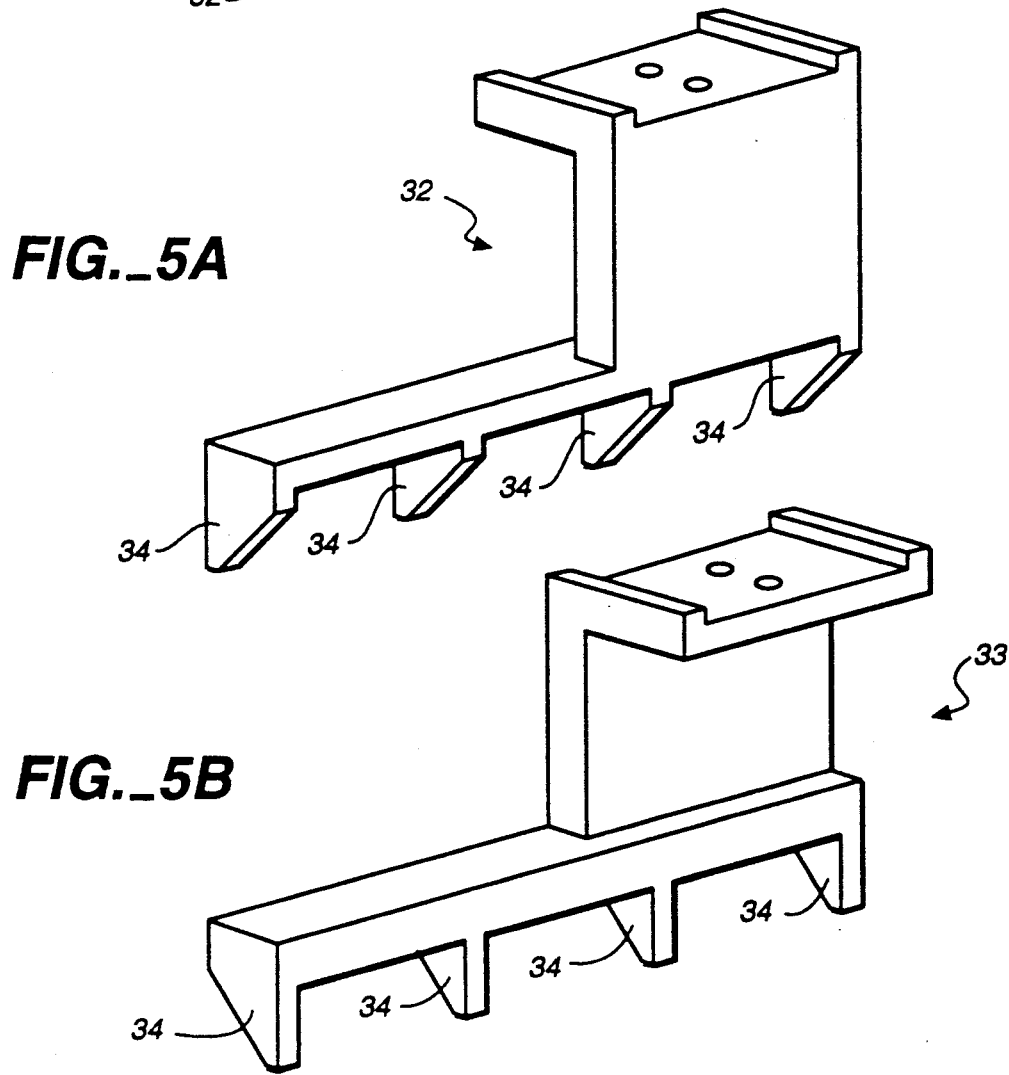
FIG._5A
FIG._5B

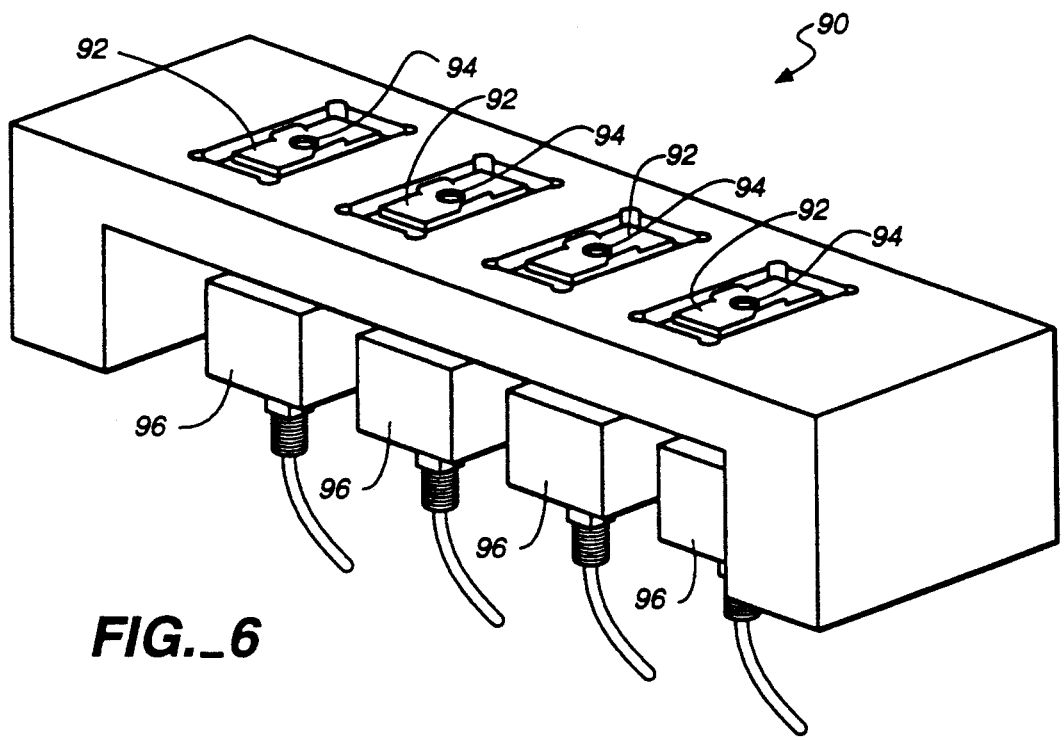
FIG._6
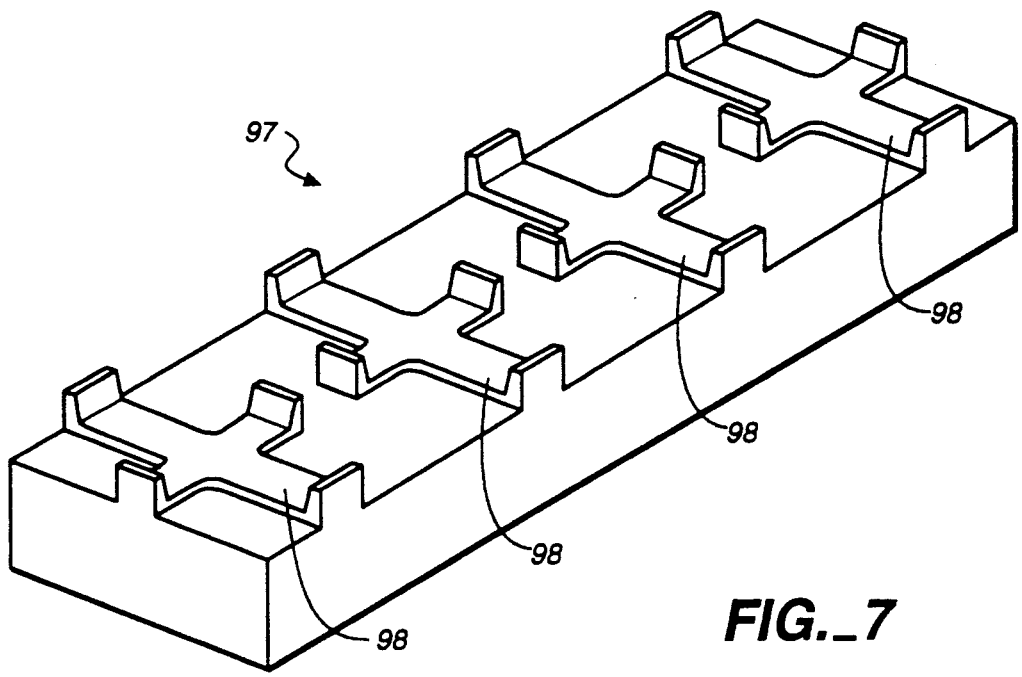
FIG._7

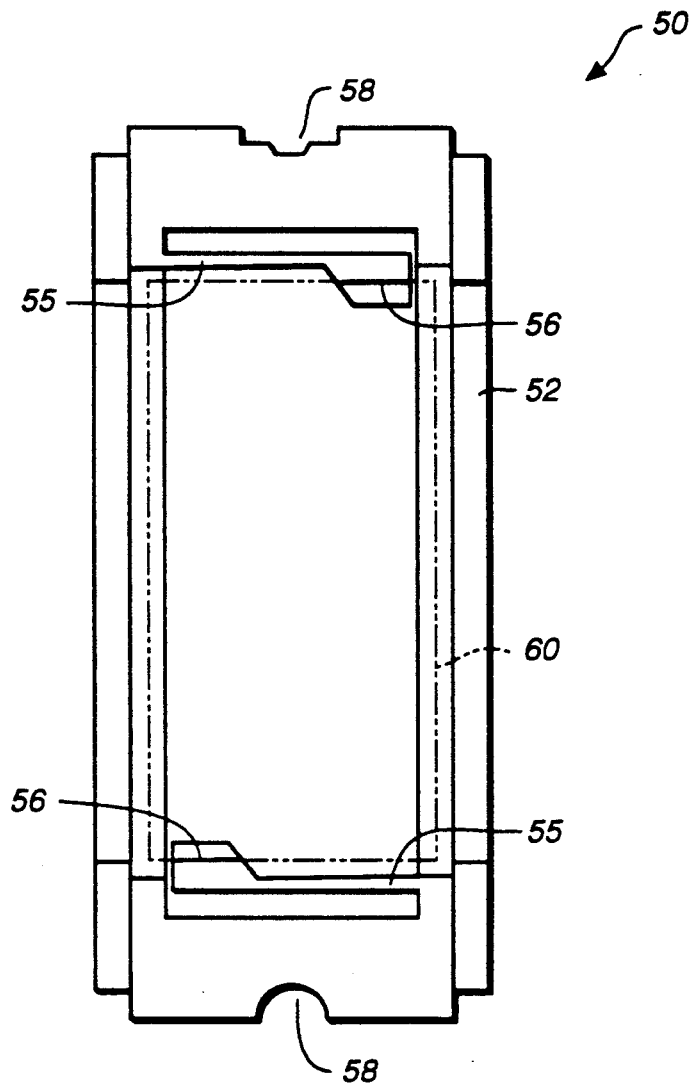
FIG._8
(PRIOR ART)

APPARATUS FOR LOADING AND UNLOADING THIN INTEGRATED CIRCUITS INTO AND FROM CARRIERS

BACKGROUND OF THE INVENTION

This invention relates to an apparatus for picking up small thin integrated circuits and loading them into individual frame-like protective carriers adapted to support them by means of elastically bendable elongated holding pieces, and also for unloading these integrated circuits from such carriers.

Many thin integrated circuits (ICs) are not only small and thin but also delicate and easily damaged. For transporting them, use is commonly made of protective carriers, and the small ICs must be extricated from such carriers before they can be put on an electronic product. FIG. 8 shows an example of such a carrier 50 characterized as being a single-piece molded structure having a frame-like housing 52 with indentations 58 (or semi-circular cut-outs) on outer edges for positioning purposes (to be explained below) and two unistructurally formed tongue-like elongated holding pieces 55 protruding inwardly therefrom in mutually opposite directions. These holding pieces 55 are elastically bendable and the distance between them is such that an IC piece (shown by broken lines at 60) can be inserted only if they are pushed slightly outward away from each other to enlarge the gap therebetween. After the IC piece 60 is thus inserted and the holding pieces 55 are released, the IC piece 60 is "captured" by knobs 56 protruding from the holding pieces 55.

In order to remove the IC piece 60 from its carrier 50, the holding pieces 55 must be pushed away from each other. As the gap between the two holding pieces 55 is increased, the IC piece 60 can be released from the carrier 50. Since these ICs are extremely delicate, they must be loaded into or picked out of their protective frames only with an extreme care. It is a general object of the present invention to provide an apparatus capable of efficiently and carefully loading thin ICs into such carriers as described above, as well as disengaging them from the carriers such that they can be transported to a specified device-assembly position.

SUMMARY OF THE INVENTION

An apparatus according to the present invention, with which the above and other objects can be accomplished, comprises a novel pick-up module robotically supported so as to be controllably movable in three dimensions. Carriers of a kind, each containing a small thin IC as described above, are assumed to be continuously delivered by a supply mechanism to a specified pick-up location in units of four. The module has a frame-like structure with four windows at the bottom such that the four of these carriers at the pick-up location can be admitted into these windows automatically and simultaneously. An actuator-controlled clamping member pushes these carriers in one direction within their individual windows so as to clamp each of them against a pin protruding into the corresponding window. The carriers thus clamped are brought to a transfer station with four seats each having an opening connected to a negative pressure source. While these carriers remain thus clamped, their holding pieces are pushed apart so as to release the ICs held inside by activating another actuator within the module. The ICs, which are placed on the seats and are kept thereon, are picked up by vacuum suction pipes connected to another negative pressure source and, while these ICs are suspended at the bottom openings of these suction pipes, the module is robotically guided to a specified discharge location where the carriers, which are now empty, are released as the actuator-controlled clamping member is retracted. The ICs are thereafter brought to their desired destinations and released either simultaneously or individually. The means for robotically supporting the module may be a prior art work table with a movable arm and a control device adapted not only to move the module three-dimensionally but also to control the actuators and the withdrawal of air through the suction pipes and the seats of the transfer station according to a specified program.

The apparatus described above can also be used for loading IC pieces into carries. The process is substantially the reverse of the disassembly operation described above, except a device with precisely machined pockets is additionally required for precisely positioning the ICs in order to permit proper mating with carriers.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a perspective view of a pick-up module embodying the present invention supported by an arm so as to be movable controllably in three dimensions;

FIG. 2 is a perspective view of a tray for delivering carriers to a specified pick-up location with or without IC pieces contained therein;

FIG. 3 is a perspective view of the clamping arm not shown in FIG. 1;

FIG. 4 is a partially sectional side view of the clamping and unlatching arms in contact with a carrier held against the gripper;

FIGS. 5A and 5B are perspective views of the pair of unlatching arms;

FIG. 6 is a perspective view of the transfer station;

FIG. 7 is a perspective view of the IC positioner; and

FIG. 8 is a plan view of a carrier of a type commonly used for protectively holding a small thin IC piece therein

DETAILED DESCRIPTION OF THE INVENTION

FIG. 1 shows a pick-up module 10 embodying the present invention, as slidably mounted on a controllably movable arm 70 of a work table (not shown) such as a multi-tasking transfer system MTTS-100 produced and sold by the assignee herein and also described in U.S. Pat. No. 5,073,079 issued Dec. 17, 1991 and assigned to the assignee herein. (U.S. Pat. No. 5,073,079 will be herein incorporated by reference.) Since such a transfer system includes power sources such as motors as well as a control device for controlling the operations of the individual components of the system, it is to be understood that the pick-up module 10 of this invention is so set as to be controllably movable three-dimensionally according to a preliminary prepared program. For the convenience of illustration, some of the components of the module 10 are not shown in FIG. 1, but will be separately illustrated and described below.

A supply system is assumed to have been established such that ICs, of a kind individually protected in a carrier as described above, are successively and continuously delivered to a specified pick-up location in units of four. For this purpose, use may be made of a so-called vibratory feeder of a known kind as shown in FIG. 2 with an elongated tray 80 having four slightly sloped grooves 82 thereon for holding tubes or troughs through which articles are transported. A small platform 85 sewing as pick-up station is provided at the lower end of the slope, and the tray 80 is set on such that its pick-up station 85 is at the specified pick-up location. During a normal disassembly operation, a vibratory unit (not shown) attached to the tray 80 is activated such that carriers, each securing an IC therein, are propelled downward through tubes or troughs held in the grooves 82 as explained above. As soon as the four of them at the pick-up station 85 are removed, a new set of four will immediately slide down into and occupy the pick-up station 85.

The module 10 has at its bottom part a gripper, or a mechanism for gripping four of the carriers 50. The gripper includes a frame-like structure (herein referred to as the nest 15), with four windows slightly larger than the carriers 50. The nest 15 is so designed that four carriers 50, delivered to and resting on the pick-up platform 85 of the tray 80, can be simultaneously and individually admitted into these windows as the module 10 is lowered from above the pick-up station 85. Each window in provided with an inwardly protruding, vertically extending pin 18 for precisely positioning an IC carrier 50 therein by engaging with the indentation 58 in its housing 52.

Directly above the nest 15, there are two actuators supported by a bracket. One of these actuators will be herein referred to as the clamping actuator 20, and the other as the unlatching actuator 30. A clamping arm 22, which is a structure having four padded claws 24 protruding downward as shown in FIG. 3, is attached to the clamping actuator 20 (although not shown in FIG. 1). The claws 24 are mutually spaced apart so as to be aligned with the four windows in the nest 15. When the module 10 is lowered to the pick-up station 85 and the nest 15 admits four carriers into its windows from the pick-up platform 85 of the tray 80, the clamping actuator 20 is activated such that the clamping arm 22 moves horizontally and grips the four carriers 50 by clamping each of them between one of its claws 24 and the pin 18 protruding from the opposite inner wall of the corresponding window in the nest 15 as shown in FIG. 4. The pin 18 fits into the cutout, or the indentation 58, in the housing 52, thereby precisely positioning the carrier 50 inside the window.

The unlatching actuator 30 may be identical to the clamping actuator 20 in structure. A pair of unlatching arms 32 and 33 (not shown in FIG. 1), each having four claws 34 protruding downward as shown respectively in FIG. 5A and FIG. 5B, is attached to the bottom of the unlatching actuator 30. These claws 34, like those on the clamping arm 22, are also mutually spaced apart so as to align with the four windows of the nest 15, and the unlatching arms 32 and 33 are so designed that, when the clamping actuator 20 is activated to clamp the four carriers 50 inside the windows of the nest 15 as explained above, the claws 34 of the unlatching arms 32 and 33 are adjacent to each of the holding pieces 55 of the clamped carriers 50 as shown in FIG. 4.

After the four carriers 50 are gripped securely between the pins 18 on the nest 15 and the claws 24 of the clamping arm 22, the module 10 is lifted and is transported to a position above what is herein referred to as the transfer station disposed near the pick-up station 85. As shown in FIG. 6, the transfer station 90 is a device comprising four seats 92, or pedestals, each provided with an opening 94 at the center connected to a negative pressure source 96. The module 10 is then lowered such that the four carriers 50 gripped thereby as explained above are individually placed on the seats 92 of the transfer station 90.

Thereafter, the unlatching actuator 30 is activated so as to cause the two unlatching arms 32 and 33 to move in opposite directions away from each other without touching the ICs 60, that is, without scraping to cause damage to them by abrasion. After the gripped ICs 60 are thus unlatched and released, the module 10 is lifted again, with the carriers 50 remaining gripped by the gripper, clamped in the nest 15 by the claws 24 of the clamping arm 22.

Behind the actuators 20 and 30, the module 10 is provided with a row of four vertically extending suction pipes 40 aligned with the windows in the nest 15 as shown in FIG. 1. Each suction pipe 40 is connected with a vacuum pump which can be independently controlled such that a small object can be picked up by suction at its bottom opening 42. As the module 10 is lifted and the released ICs 60 are separated from the carriers 50 as explained above, the module 10 is positioned such that the suction pipes 40 have their bottom openings 42 located immediately above the ICs 60 remaining in the seats 92. The withdrawal of air through the openings 94 of the transfer station 90 is discontinued, the pipes 40 are lowered, the vacuum pumps associated with the pipes 40 are activated, and the pipes 40 are then raised, such that the ICs 60 are lifted from the transfer station 90 and become suspended at the bottom openings 42 of the suction pipes 40, as the module 10 is raised and moved to a discharge tray disposed near the transfer station 90.

The discharge tray is structured similarly to the supply tray 80 and hence will not be separately illustrated. Unlike the supply tray 80, however, the discharge tray has an elevated discharge platform to which are connected four elongated downwardly sloped grooves such that carriers deposited on the discharge platform will slide down through pipes or troughs held by the grooves to a discharge container or the like. The module 10 is positioned such that the carriers 50, which are still clamped in the nest 15 by the claws 24 of the clamping arm 22, are directly above the discharge platform of the discharge tray. The clamping actuator 20 is then activated and the clamping arm 22 is moved so as to cause its claws 24 to release the carriers 50 which are now empty. The released carriers 50 drop onto the discharge platform of the discharge tray, immediately start sliding down through the sloped grooves and are discharged, leaving the discharge platform empty and ready to receive a next batch of empty carriers to be disposed of.

As the empty carriers are thus being discharged, the ICs 60, which were picked up from the seats 92 of the transfer station 90, remain suspended at the bottom openings 42 of the suction pipes 40. They are thereafter transported to whichever location or locations where they are intended and deposited by controlling the vertical motion of the vacuum pumps individually associated with the vacuum suction pipes 40.

As mentioned above, the module 10 as described above can be used also for the purpose of loading the IC pieces 60 individually into empty carriers 50. For such an assembly process, the IC pieces 60 to be loaded may typically be brought in on trays with internal pockets. Such pockets are generally loose and allow the IC pieces therein to move, although slightly. For the purpose of robotically loading them into carriers, however, this uncertainty of exact positions of the IC pieces in these pockets is not acceptable. For this reason, use may be made of a so-called precisor, which in a positioning device for IC pieces having, as shown generally at 97 in FIG. 7, precisely machined pockets 98 for IC pieces.

The loosely carried IC pieces in tray pockets (not shown) are lifted by the vacuum suction pipes 40 as explained above in connection with the description of the unloading process and deposited into the pockets 98 of the precisor 97 so as to be exactly positioned. Immediately thereafter, these exactly positioned IC pieces are retrieved from the pockets 98 and brought to the transfer station 90. Empty carriers 50 may be supplied by means of the elongated tray 80 described above. The module 10 is operated similarly as explained above to pick up four of these empty carriers 50, supporting them individually within the windows of its nest 15. The nest is positioned above the transfer station 90 and, after the unlatching actuator 30 causes the unlatching arms 32 and 33 to push the holding pieces 55 apart to increase the gap therebetween, the nest is lowered such that the exactly positioned IC pieces 60 are accepted into the carriers 50. The unlatching actuator 30 is then deactivated, releasing the holding pieces 55 from their outwardly pushed condition and thereby catching the IC pieces 60 therebetween as shown in FIG. 8.

The present invention has been described above by way of only one embodiment, but it is to be understood that many modifications and variations may be made within the scope of the invention. For example, the sequence of operations described above may be modified such that the ICs are left in the seats 92 of the transfer station 90 while the module 10 transports the empty carriers to the discharge tray. The ICs may be picked up thereafter from the seats 92. All such modifications and variations that may be apparent to a person skilled in the art are intended to be included within the scope of this invention.

What is claimed is:

1. In combination with a robotic system which includes a mechanism for controllably moving an object three-dimensionally and a control device for controlling operations of motors and vacuum pumps, an apparatus for loading and unloading thin integrated circuits into or from individual carriers, each of said carriers comprising a frame-like housing with two elastically bendable holding pieces extending inwardly from said housing to hold one of said integrated circuits therebetween inside said housing, said apparatus comprising:

a transfer station having seats for individually depositing thereon a plurality of said thin integrated circuits; and a pick-up unit supported and controlled by said robotic system, said pick-up unit including gripping means for controllably gripping and releasing a specified number of said carriers, unlatching means for controllably bending said holding pieces of said carriers gripped by said gripping means, and suction means for controllably picking up said thin integrated circuits by suction by applying negative pressure to one side thereof.

2. The apparatus of claim 1 wherein said seats each have an air hole, said control device of said robotic system being adapted to controllably cause air to be drawn through said air holes to thereby apply negative pressure to said integrated circuits on said seats.

3. The apparatus of claim 2 wherein said unlatching means includes a pair of members controlled by said control device to move away from each other.

4. The apparatus of claim 1 wherein said gripping means includes carrier-supporting means for having said carriers pressed thereagainst and pushing means controlled by said control device of said robotic system for pushing said carriers against said carrier-supporting means.

5. The apparatus of claim 4 wherein said carrier-supporting means includes a frame-like structure with a specified number of windows each adapted to contain one of said carriers therein.

6. The apparatus of claim 5 wherein said frame-like structure has protruding pins in each of said windows, said pins being adapted to engage with indentations on one edge of said carriers as said carriers are pushed by said pushing means against said carrier-supporting means, thereby supporting said carriers at predetermined positions within said windows.

7. The apparatus of claim 6 wherein said unlatching means is adapted to bend said holding pieces of said carriers being pressed against said pins by said pushing means without touching said integrated circuits being held within said carriers.

8. The apparatus of claim 1 wherein said suction means include vertical suction pipes with bottom openings, said control device controllably causing air to be drawn through said suction pipes.

9. The apparatus of claim 1 further comprising integrated circuit positioning means for precisely positioning a plurality of said integrated circuits with respect to one another.

* * * * *